(12) United States Patent
Huo et al.

(10) Patent No.: US 9,542,311 B2
(45) Date of Patent: Jan. 10, 2017

(54) PROGRAMMING MODE FOR MULTI-LAYER STORAGE FLASH MEMORY ARRAY AND SWITCHING CONTROL METHOD THEREOF

(75) Inventors: Wenjie Huo, Hubei (CN); Jipeng Xing, Hubei (CN); Dongxia Zhou, Hubei (CN)

(73) Assignee: MEMORIGHT (WUHAN) CO., LTD., Wuhan, Hubei (CN)

( * ) Notice: Subject to any disclaimer, the term of this patent is extended or adjusted under 35 U.S.C. 154(b) by 551 days.

(21) Appl. No.: 14/119,151

(22) PCT Filed: Mar. 23, 2012

(86) PCT No.: PCT/CN2012/072967
§ 371 (c)(1),
(2), (4) Date: Nov. 20, 2013

(87) PCT Pub. No.: WO2012/159492
PCT Pub. Date: Nov. 29, 2012

(65) Prior Publication Data
US 2014/0108712 A1 Apr. 17, 2014

(30) Foreign Application Priority Data
May 26, 2011 (CN) .......................... 2011 1 0138945

(51) Int. Cl.
*G06F 12/02* (2006.01)
*G11C 11/56* (2006.01)
*G11C 16/34* (2006.01)
*G11C 16/04* (2006.01)

(52) U.S. Cl.
CPC ....... *G06F 12/0246* (2013.01); *G11C 11/5628* (2013.01); *G11C 16/3427* (2013.01); *G11C 16/3495* (2013.01); *G06F 2212/7206* (2013.01); *G11C 16/0483* (2013.01); *G11C 2211/5648* (2013.01)

(58) Field of Classification Search
CPC ................... G11C 2211/5648; G11C 16/3495; G11C 16/3427; G11C 11/5628; G11C 16/0483; G11C 16/10; G06F 12/0246; G06F 2212/7202; G06F 2212/7206
USPC .......................................... 711/103, 154, 170
See application file for complete search history.

(56) References Cited

U.S. PATENT DOCUMENTS

2013/0124787 A1* 5/2013 Schuette ............. G06F 12/0246
711/103

* cited by examiner

*Primary Examiner* — Hong Kim
(74) *Attorney, Agent, or Firm* — Kile Park Reed & Houtteman LLC

(57) ABSTRACT

The present invention relates to a programming mode for improving the reliability of a multi-layer storage flash memory device in a semiconductor storage field. The present invention provides several programming modes for improving the reliability of a multi-layer storage flash memory device and switching control methods thereof, based on the technical conception of skipping some specific logic pages in the programming process to reduce the impact of the floating gate coupling effect on the operation of the flash memory. By skipping some logic pages, the present invention effectively reduces the floating gate coupling effect in the horizontal, diagonal and vertical directions of the multi-layer storage flash memory in the programming process. Therefore, the error rate is reduced, the service life of the device is prolonged, and the reliability of the whole system is enhanced.

3 Claims, 6 Drawing Sheets

Programming mode 1

Programming mode 2

Programming mode 3

☐ Programming page
☐ Non-programming page

PROGRAMMING MODE FOR MULTI-LAYER STORAGE FLASH MEMORY ARRAY AND SWITCHING CONTROL METHOD THEREOF

BACKGROUND

Technical Field

The present invention relates to a semiconductor storage field, and more particularly to a programming mode for improving the reliability of a multi-layer storage flash memory device in a solid-state hard disk controller, a flash memory controller, and the like, where the flash memory device is used as a storage medium.

Related Art

Different from a single-layer storage flash memory, a storage unit of a multi-layer storage flash memory device can save multi-bit logic information through setting multiple groups of threshold voltages, so as to significantly increase the storage capacity of the flash memory device without increasing hardware overhead. With the advantages of a high integration degree and low cost, the multi-layer storage flash memory device becomes the mainstream for flash memory devices.

To save multi-bit data in one same storage unit, a storage unit in a multi-layer storage flash memory need several times of programming, as shown in FIG. 1. When a write operation only needs to be performed on a most significant bit (MSB) bit in the multi-layer storage flash memory, the multi-layer storage flash memory directly transfers from an erasing state "E" to a second programming state "D2", which requires the least time for programming. When a write operation is performed on an LSB page in the multi-layer storage flash memory, the multi-layer storage flash memory switches from the erasing state "E" to a first programming state "D1". When the multi-layer storage flash memory needs to change the states of the MSB and LSB bits, the programming work is completed through two rounds of operations: in the first round operation, the erasing state "E" is first switched to the first programming state "D1", and in the second round operation, the first programming state "D1" is then switched to the third programming state "D3".

An array structure inside the multi-layer storage flash memory is shown in FIG. 2. An MSB bit and an LSB bit of a physical unit in the multi-layer storage flash memory are mapping into an MSB page and an LSB page, respectively. The physical unit in line WL0 is mapped into pages 0, 1, 4, and 5, respectively, in which page 0 and page 1 are MSB pages, whereas page 4 and page 5 are LSB pages. The physical unit in line WL1 is mapped into pages 2, 3, 8, and 9, respectively, in which page 2 and page 3 are MSB pages, whereas page 8 and page 9 are LSB pages. In this manner, in the last line WL63, page 250 and page 251 are MSB pages, whereas page 254 and page 255 are LSB pages.

A severe floating gate coupling effect exists in a flash memory device smaller than 45 nm. As shown in FIG. 3, the change of a floating gate voltage of a storage unit in the flash memory array causes a disturbance to a floating gate voltage of an adjacent storage unit, resulting in unexpected flipping of data saved in the adjacent storage unit.

Such a floating gate coupling effect in the flash memory device severely interferes with data saved in the flash memory. Especially for a multi-layer storage flash memory, because storage units require several times of programming, the influences caused by the floating gate coupling effect are severer. The reliability of a multi-layer storage flash memory is far lower than that of a conventional single-layer storage flash memory. Therefore, a reliability enhancement technology needs to be adopted in a flash memory controller to constrain the error rate of the multi-layer storage flash memory and prolong the service life of a device.

SUMMARY

The technical problem to be solved by the present invention is to provide a programming mode for improving the reliability of a multi-layer storage flash memory device, so as to reduce an error rate of a multi-layer storage flash memory during use, prolong the service life of the device, and enhance the reliability of whole system.

To solve the foregoing technical problem, the technical conception for improving the reliability of a multi-layer storage flash memory device and reducing an error rate of the multi-layer storage flash memory provided in the present invention is a method of skipping some specific logic pages in the programming process to reduce the impact of the floating gate coupling effect on the operation of the flash memory.

Based on the foregoing technical conceptions, the present invention provides three specific programming modes for a multi-layer storage flash memory array, where the multi-layer storage flash memory array is operated by a flash memory controller, in a programming process for a flash memory, the flash memory controller selects to skip a part of logic pages for programming, and selects to skip LSB pages in different directions, and at least three programming modes are included:

In programming mode 1, the sequence number Npass of the logic page that is selected to skip in a programming process in the method is:

$$N_{pass} = \begin{cases} 4i, 1 \le i \le 63 \\ 254, i = 64 \end{cases}$$

where i is a natural number, and $1 \le i \le 64$. Through skipping these logic pages, the floating gate coupling effect in the horizontal direction in the multi-layer storage flash memory in a programming process can be effectively reduced, so as to lower the error rate.

In programming mode 2, in a programming process, the sequence number Npass of the logic page that is selected to skip meets the following rule:

$$N_{pass} = \begin{cases} 4i, i = 2n+1 \\ 4i+1, i = 2n \\ 255, i = 64, \end{cases} \text{ or,}$$

$$N_{pass} = \begin{cases} 4i+1, i = 2n+1 \\ 4i, i = 2n \\ 254, i = 64 \end{cases}$$

where n is a natural number, and $1 \le n \le 31$.

Programming mode 2 is a method further improved on the basis of programming mode 1. Programming mode 2 skips two groups of LSB pages adjacent in the diagonal direction among physical pages of the multi-layer storage flash memory in a programming process, so as to reduce the programming times in the diagonal direction of the multi-layer storage flash memory array to obtain a lower error rate, thereby reducing interferences between storage units of the flash memory in the programming process.

In programming mode 3, the sequence number Npass of the logic page that is selected to skip in a programming process is:

$$N_{pass} = \begin{cases} 4i+1, i = 2n+1 \\ 4i, i = 2n+1, \end{cases} \text{ or,}$$

$$N_{pass} = \begin{cases} 4i+1, i = 2n \\ 4i, i = 2n \end{cases}$$

where n is a natural number, and 1≤n≤31.

Programming mode 3 is improved on the basis of programming mode 2, so as to reduce interferences between storage unit arrays in the vertical direction. Programming mode 3 skips LSB pages of adjacent two groups separated by a physical line among physical pages in the multi-layer storage flash memory in a programming process, thereby reducing the programming times in the vertical direction of the multi-layer storage flash memory array to obtain a lower error rate, and reducing interferences between flash memory storage units in a programming process.

The foregoing three different programming modes clearly reduce the error rate of the flash memory block and increase the reliability of the flash memory array.

To further prolong the work life of the flash memory device, the present invention further provides a switching control method of a programming mode for a multi-layer storage flash memory array, which includes the following steps:

according to an error number of the flash memory, in the flash memory controller, setting thresholds in three levels in an increasing order, which are a first threshold, a second threshold, and a third threshold;

when a multi-layer storage flash memory starts to be used, adopting a normal programming mode of performing a write operation on all logic pages in a multi-layer storage flash memory block during programming, and at the same time monitoring an error number during use;

when errors of the block reaches the first threshold during use, adopting, by a controller, programming mode 1 to perform a programming operation on the multi-layer storage flash memory, and at the same time continuing to monitor the error number of the multi-layer storage flash memory;

during continued use, when the errors of the block increase to reach the second threshold during use, switching the programming mode of the controller from programming mode 1 to programming mode 2, and continuing to monitor an error condition of the flash memory; and when the error number continues to increase to reach the third threshold, adopting, by the controller, programming mode 3 for programming to operate the multi-layer storage flash memory in an optimal mode.

By means of such a switching mode, the controller can balance the programming times of each physical storage unit and acquire the lowest error rate, so as to reach a balance between capacity and the error rate and effectively prolong the service life of the multi-layer storage flash memory.

BRIEF DESCRIPTION OF THE DRAWINGS

The present disclosure will become more fully understood from the detailed description given herein below for illustration only, and thus are not limitative of the present disclosure, and wherein.

In the following, the technical solutions of the present invention are further illustrated in detail with reference to the accompanying drawings and specific implementations.

DETAILED DESCRIPTION

A programming process in a multi-layer storage flash memory takes a physical block as a unit. However, in the programming process, a floating gate coupling effect exists between pages inside a physical block. Such a floating gate coupling effect interferes with storage units adjacent in the horizontal, diagonal, and vertical directions in the storage array, respectively. The present invention designs three programming modes to effectively reduce the floating gate coupling effect. In a programming process, through a mode of skipping special programming pages of adjacent storage units, the floating gate coupling effects in the horizontal, diagonal, and vertical directions are reduced, respectively, and on such a basis, a switching mode of various programming mode is adopted to balance loss, thereby further prolonging the life of the flash memory device.

Figure 1:
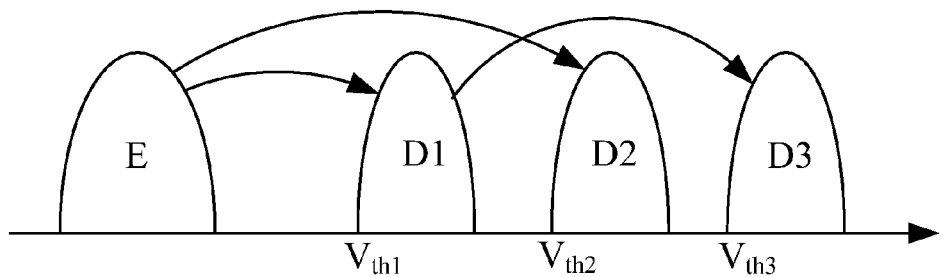
FIG. 1 is a state transfer diagram of a multi-layer storage flash memory device.
Figure 2:
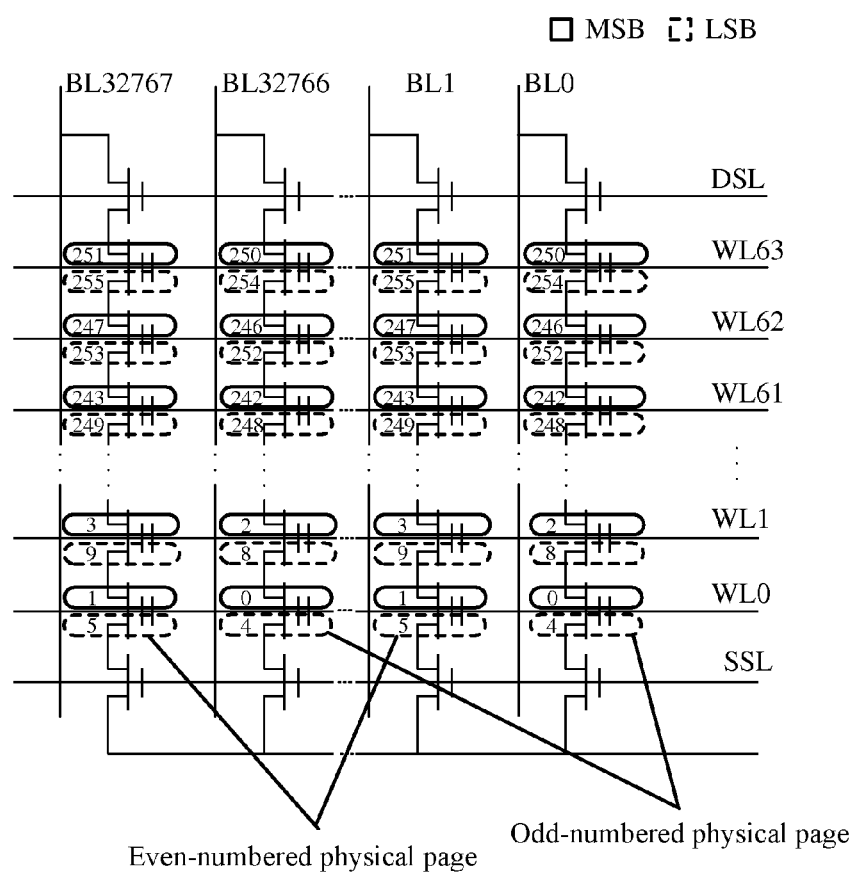
FIG. 2 is a storage array diagram of a multi-layer storage flash memory device.
Figure 3:
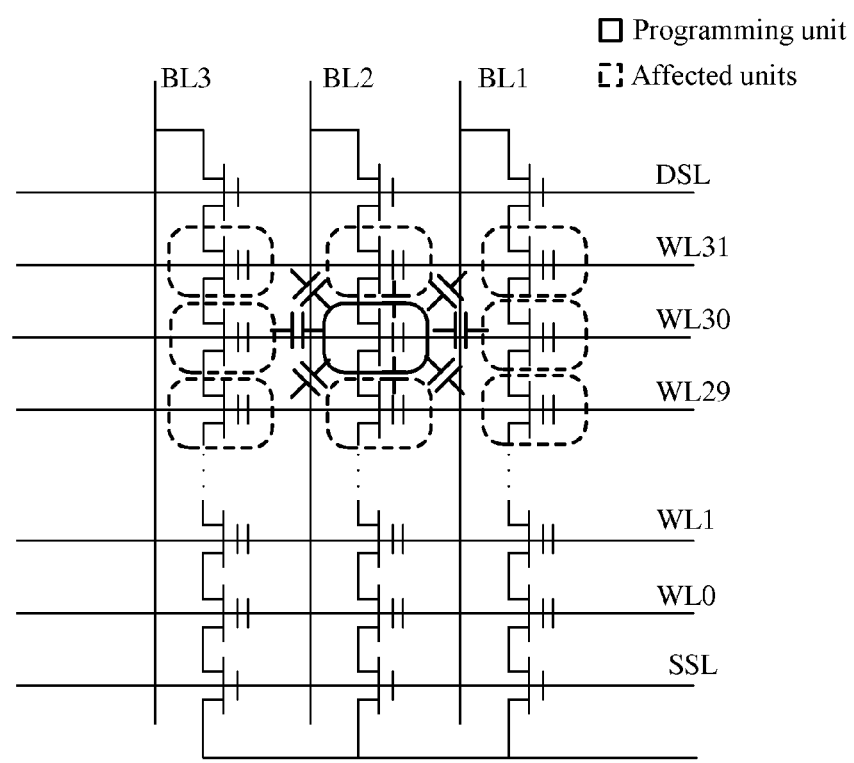
FIG. 3 is a floating gate coupling effect of a multi-layer storage flash memory device.
Figure 4:
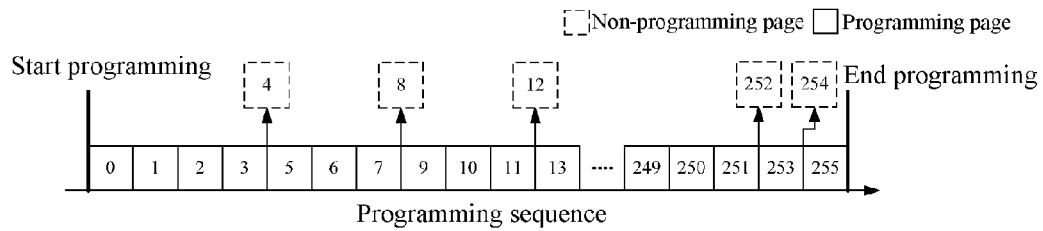
FIG. 4 is a programming sequence of programming mode 1.

Programming mode 1 selects to skip some logic pages of a block in a multi-layer storage flash memory in a programming process, so as to reduce the floating gate coupling effect in the horizontal direction. The specific programming mode of programming mode 1 is shown in FIG. 4. After the programming is started, programming mode 1 first performs programming on pages 0, 1, 2, and 3 sequentially, and then skips page 4; then performs programming on pages 5, 6, and 7, and skips page 8; performs programming on pages 9, 10, and 11, and skips page 12; in this manner, at the end of the block, programming mode 1 performs programming on pages 249, 250, and 251, and skip page 252; in the end, performs programming on page 253 and page 255, and skips page 254, so as to complete the entire programming process for the multi-layer storage flash memory. In programming mode 1, the sequence number Npass of the logic page that needs to skip is:

$$N_{pass} = \begin{cases} 4i, 1 \le i \le 63 \\ 254, i = 64 \end{cases}$$

where i is a natural number, and 1≤i≤64. Programming mode 1 can effectively reducing the floating gate coupling effect in the multi-layer storage flash memory in a programming process through skipping these pages, thereby lowering the error rate.

Figure 5:
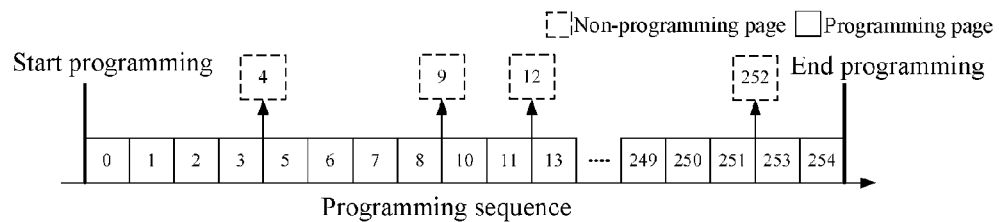
FIG. 5 is a programming sequence of programming mode 2.

Programming mode 2 is further improved on the basis of programming mode 1. Programming mode 2 mainly obtains a lower error rate through reducing the programming times in the diagonal direction of the multi-layer storage flash memory, the specific process of which is shown in FIG. 5. After the programming is started, programming mode 2 first performs programming on pages 0, 1, 2, and 3, sequentially, and then skips page 4; then performs programming on pages 5, 6, 7, and 8, and then skips page 9; and then performs programming on pages 10 and 11, and then skips page 12; in this manner, at the end of the block, programming mode 2 performs programming on pages 249, 250, and 251, and skips page 252; and in the end, performs programming, and skips page 255, so as to complete the entire programming process for the multi-layer storage flash memory block. In programming mode 2, the sequence number Npass of the skipped logic page meets the following rule:

$$N_{pass} = \begin{cases} 4i, i = 2n+1 \\ 4i+1, i = 2n \\ 255, i = 64 \end{cases}$$

where n is a natural number, and $1 \le n \le 31$.

In addition, programming mode 2 further has another equivalent programming sequence, that is, the sequence number Npass of the skipped logic page meets the following rule:

$$N_{pass} = \begin{cases} 4i+1, i = 2n+1 \\ 4i, i = 2n \\ 254, i = 64, \end{cases}$$

where n is a natural number, and $1 \le n \le 31$.

Through programming mode 2, interferences between the flash memory storage units in the programming process are further reduced.

Figure 6:
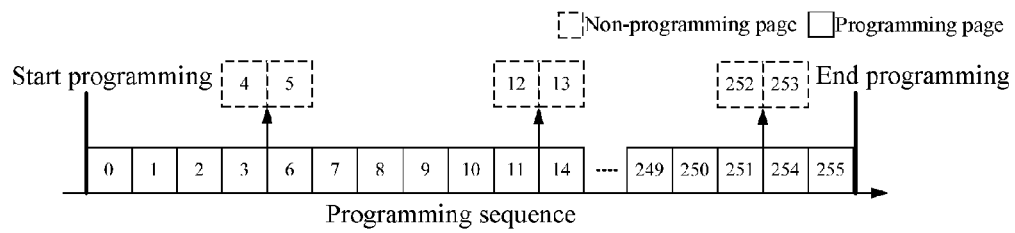
FIG. 6 is a programming sequence of programming mode 3.

Programming mode 3 mitigates mutual interferences in the vertical direction in the storage unit array on the basis of programming mode 2. The specific programming mode of programming mode 3 is shown in FIG. 6. After the programming is started, programming mode 3 first performs programming on pages 0, 1, 2, and 3 sequentially, and then skips page 4, 5; then performs programming on pages 6, 7, 8, 9, 10, and 11, and then skips pages 12 and 13; in this manner, at the end of the block, programming mode 3 performs programming on pages 249, 250, and 251, and then skips pages 252 and 253; in the end, performs programming on pages 254 and page 255, so as to complete the entire programming process for the multi-layer storage flash memory. In programming mode 3, the sequence number Npass of the logic page that needs to skip is:

$$N_{pass} = \begin{cases} 4i+1, i = 2n+1 \\ 4i, i = 2n+1, \end{cases}$$

where n is a natural number, and $1 \le n \le 31$.

In addition, programming mode 3 further has another equivalent programming sequence, that is, the sequence number Npass of the skipped logic page meets the following rule:

$$N_{pass} = \begin{cases} 4i+1, i = 2n \\ 4i, i = 2n, \end{cases}$$

where n is a natural number, and $1 \le n \le 31$. Programming mode 3 further effectively reduces the floating gate coupling effect in the multi-layer storage flash memory in a programming process through skipping these pages, thereby reducing the error rate.

Figure 7:
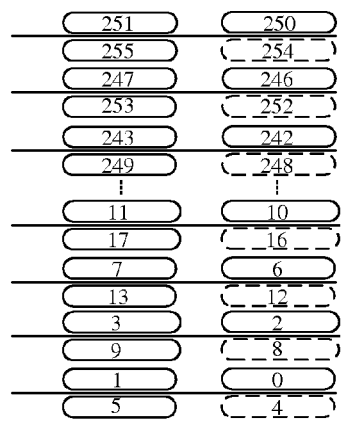
FIG. 7 is a comparison diagram of programming pages of programming modes 1, 2, and 3.
Figure 7:
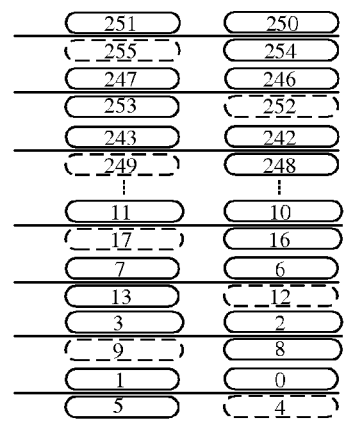
Figure 7:
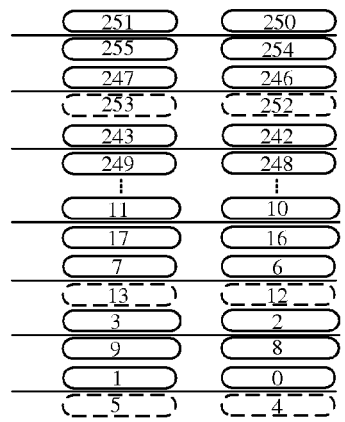

After performing programming on the flash memory with the foregoing programming mode, the programming page in the flash memory is shown in FIG. 7. Programming mode 1 skips a group of LSB pages on one same physical line in the flash memory block; programming mode 2 skips two groups of LSB pages in the diagonal direction in the flash memory block; and programming mode 3 skips two adjacent groups of LSB pages separated by a physical line in the flash memory block.

Figure 8:
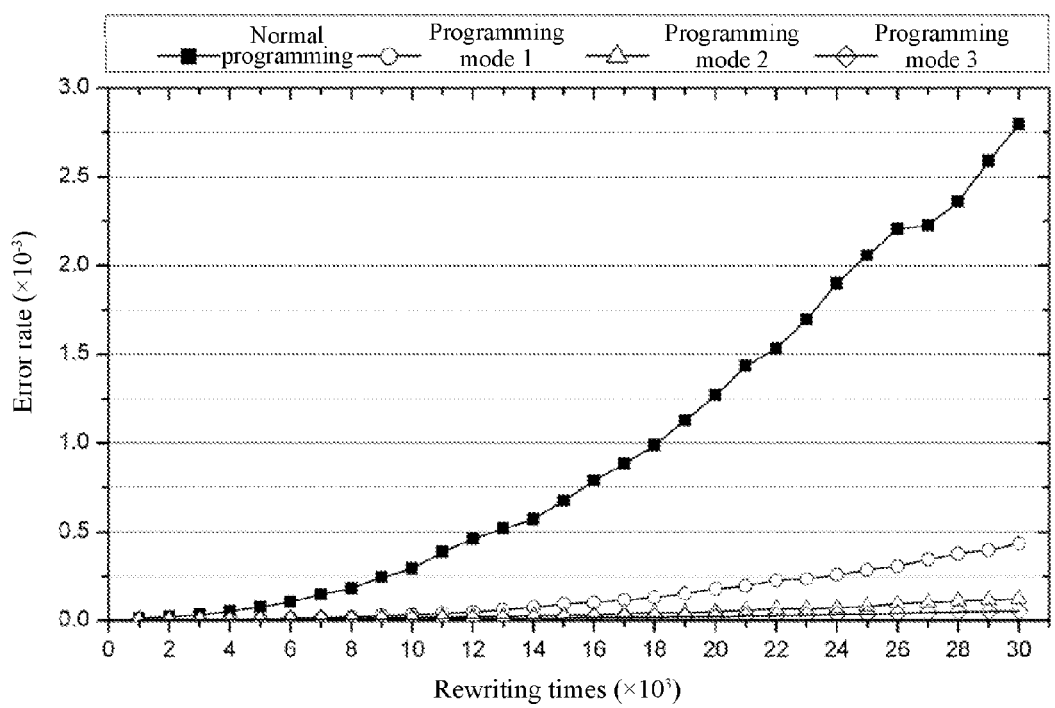
FIG. 8 is a comparison diagram of test results of programming modes 1, 2, and 3.

The three different programming modes clearly improve the error rate of the flash memory block, as shown in FIG. 8. After 30,000 times of cyclic rewriting, the flash memory block adopting a normal programming mode has the highest error rate, the flash memory block adopting programming mode 1 has an error rate clearly lower than that adopting the normal programming mode, the flash memory block adopting programming mode 2 has an error rate lower than that adopting programming mode 1, and the flash memory block adopting programming mode 3 has the lowest error rate.

Figure 9:
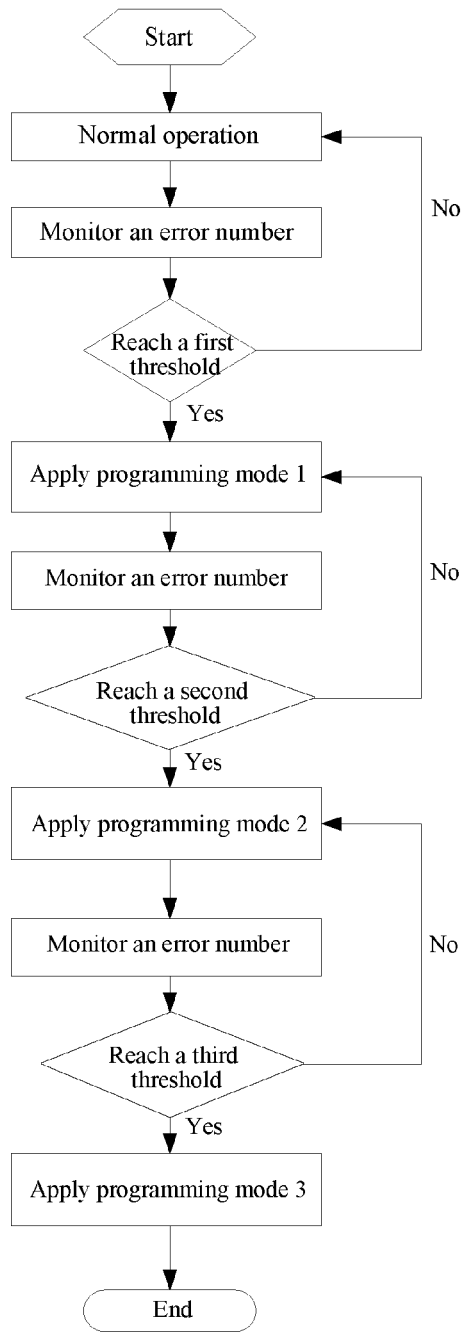
FIG. 9 is a flow chart of switching control of a programming mode of a multi-layer storage flash memory device.

To further prolong the work life of a flash memory device, the present invention adopts a switching control method of several programming modes to balance loss of the flash memory device, the control process of which is shown in FIG. 9. According to the error number of the flash memory, in a flash memory controller, thresholds of three levels are set in an increasing order, which are a first threshold, a second threshold, and a third threshold. The setting of the three groups of thresholds may be a priori setting by a person skilled in the art in advance through a stress test on the flash memory device and according to a test of a life condition of the flash memory device. For example, the first threshold is set to be that the error rate reaches $2.5 \times 10^{-5}$, the second threshold is set to be that the error rate reaches $5 \times 10^{-5}$, and the third threshold is set to be that the error rate reaches $8 \times 10^{-5}$. When a multi-layer storage flash memory starts to be used, a normal programming mode is adopted, that is, a write operation is performed on all logic pages in the multi-layer storage flash memory block during programming, and at the same time, an error number during use is monitored. When the errors of the block reach the first threshold during use, the controller adopts programming mode 1 to perform a programming operation on the multi-layer storage flash memory, and at the same time continues to monitor the error number of the multi-layer storage flash memory. During continued use, when the errors of the block reach the second threshold during use, the programming mode of the controller is switched from programming mode 1 to programming mode 2, and the error condition of the flash memory continues to be monitored. After the error number continues to increase to reach the third threshold, the controller adopts programming mode 3 for programming to operate the multi-layer storage flash memory in an optimal mode. Through such a switching mode, the controller can balance the programming times of each physical storage unit and acquire the lowest error rate, so as to reach a balance between capacity and an error rate and effectively prolong the service life of the multi-layer storage flash memory.

Finally, it should be noted that the above embodiments are merely provided for describing the technical solutions of the present invention, but not intended to limit the technical solutions of the present invention. It should be understood by persons of ordinary skill in the art that although the present invention has been described in detail with reference to the preferred embodiments, modifications or equivalent replacements can be made to the technical solutions of the present invention, as long as such modifications or equivalent replacements do not depart from the scope of the present invention as defined by the appended claims.

What is claimed is:

1. A switching control method of a programming mode for a multi-layer storage flash memory array, wherein the multi-layer storage flash memory array is operated by a flash memory controller, in a programming process for a flash memory, the flash memory controller selects to skip a part of logic pages for programming, and selects to skip least significant bit (LSB) pages in different directions, and switches to control one of at least three programming modes are comprised:

programming mode 1: in a programming process, selecting to skip a group of least significant bit (LSB) pages adjacent in a horizontal direction among physical pages of a multi-layer storage flash memory for programming, and reducing a programming times in the horizontal direction of the multi-layer storage flash memory array, a sequence number Npass of the skipped logic page being:

$$N_{pass} = \begin{cases} 4i, 1 \leq i \leq 63 \\ 253, i = 64 \end{cases}$$

where i is a natural number, and $1 \leq i \leq 64$;

programming mode 2: in a programming process, selecting to skip a part of logic pages for programming, and in a programming process, skipping two groups of LSB pages adjacent in a diagonal direction among physical pages of a multi-layer storage flash memory, and reducing a programming times in the diagonal direction of the multi-layer storage flash memory array, a sequence number Npass of the skipped logic page being:

$$N_{pass} = \begin{cases} 4i, i = 2n+1 \\ 4i+1, i = 2n \\ 255, i = 64, \end{cases}$$

$$N_{pass} = \begin{cases} 4i+1, i = 2n+1 \\ 4i, i = 2n \\ 254, i = 64 \end{cases}$$

where n is a natural number, and $1 \leq n \leq 31$; and, programming mode 3: in a programming process, skipping two adjacent groups of LSB pages separated by a physical line among physical pages of a multi-layer storage flash memory, and reducing a programming times in a vertical direction of the multi-layer storage flash memory array, a sequence number Npass of the skipped logic page being:

$$N_{pass} = \begin{cases} 4i+1, i = 2n+1 \\ 4i, i = 2n+1, \end{cases} \text{ or,}$$

$$N_{pass} = \begin{cases} 4i+1, i = 2n \\ 4i, i = 2n \end{cases}$$

where n is a natural number, and $0 \leq n \leq 31$.

2. The switching control method of a programming mode for the multi-layer storage flash memory array of claim 1, comprising the following steps:

when a multi-layer storage flash memory starts to be used, adopting a normal programming mode of performing a write operation on all logic pages in a multi-layer storage flash memory block during programming, and at the same time monitoring an error number during use;

when errors of the block reaches a first threshold during use, adopting, by a controller, programming mode 1 to perform a programming operation on the multi-layer storage flash memory, and at the same time continuing to monitor the error number of the multi-layer storage flash memory; and during continued use, when the errors of the block increase to reach a second threshold during use, switching the programming mode of the controller from programming mode 1 to programming mode 2, and continuing to monitor an error condition of the flash memory.

3. The switching control method of a programming mode for a multi-layer storage flash memory array according to claim 2, further comprising the following steps:

in the process of switching to programming mode 2 and continuing to perform the programming operation on the multi-layer storage flash memory, when the monitored error number of the flash memory continues to increase to reach a third threshold, adopting, by the controller, programming mode 3 for programming to operate the multi-layer storage flash memory in an optimal mode.

* * * * *